United States Patent
Grizzi

(10) Patent No.: US 6,762,234 B2
(45) Date of Patent: Jul. 13, 2004

(54) FORMULATION FOR DEPOSITING A LIGHT-EMITTING POLYMER LAYER

(75) Inventor: Ilaria Grizzi, Cambridge (GB)

(73) Assignees: Cambridge Display Technology Ltd., Cambridge (GB); Seiko Epson Corporation, Tokyo (JP)

( * ) Notice: Subject to any disclaimer, the term of this patent is extended or adjusted under 35 U.S.C. 154(b) by 73 days.

(21) Appl. No.: 10/060,444

(22) Filed: Jan. 30, 2002

(65) Prior Publication Data

US 2003/0173563 A1 Sep. 18, 2003

Related U.S. Application Data

(63) Continuation of application No. PCT/GB00/03349, filed on Aug. 30, 2000.

(30) Foreign Application Priority Data

Aug. 31, 1999 (GB) .............................................. 9920543

(51) Int. Cl.$^7$ ................................................. C08K 5/01
(52) U.S. Cl. ...................................... 524/474; 427/445
(58) Field of Search ........................... 524/474; 427/445

(56) References Cited

U.S. PATENT DOCUMENTS

| | | | |
|---|---|---|---|
| 5,777,070 A | | 7/1998 | Inbasekaran et al. |
| 5,849,443 A | * | 12/1998 | Visser et al. .................. 430/31 |
| 5,912,473 A | | 6/1999 | Wakita et al. |

FOREIGN PATENT DOCUMENTS

| | | |
|---|---|---|
| EP | 0 707 022 A2 | 4/1996 |
| EP | 0 825 242 A2 | 2/1998 |
| EP | 0 923 083 A1 | 6/1999 |
| EP | 1 083 775 A1 | 3/2001 |
| EP | 0 609 478 A1 | 8/2001 |
| GB | 2 102 010 A | 5/1982 |
| GB | 2 161 822 A | 1/1986 |
| GB | 2 336 553 A | 10/1999 |
| JP | 11224779 | 8/1999 |
| WO | WO 99/12398 | 3/1999 |
| WO | WO 99/13692 | 3/1999 |
| WO | WO 99/54385 | 10/1999 |

OTHER PUBLICATIONS

Nonlinear Optics, 1999, vol. 20, pp. 269–295, "Thermally Stable Poly(fluorene) Copolymers for Blue–Light Emission".

* cited by examiner

Primary Examiner—Kriellion A. Sanders
(74) Attorney, Agent, or Firm—Harness, Dickey & Pierce, P.L.C.

(57) ABSTRACT

The present invention provides formulations which facilitate the direct deposition of patterned polymer films. In particular, the present invention provides a formulation with which polymer films which exhibit improved emission can be uniformly deposited, particularly in the context of relatively high molecular weight polymers with intrinsically rigid conjugated systems. By way of example, a formulation comprising a conjugated polymer dissolved in a solvent comprising at least one substance selected from the group consisting of terpenes and polyalkylated aromatic compounds are demonstrated.

22 Claims, 3 Drawing Sheets

ISODURENE

TERPINOLENE

LIMONENE

CYMENE

α-TERPINEOL

FORMULATION FOR DEPOSITING A LIGHT-EMITTING POLYMER LAYER

This is a continuation of PCT/GB00/03349 filed Aug. 30, 2000. The present invention relates to a formulation for depositing a conjugated polymer layer in a light-emitting device (LED).

BACKGROUND AND SUMMARY OF THE INVENTION

Light-emitting devices using as the light-emitting layer a semiconductive conjugated polymer are known. FIG. 1 shows the construction of a simple light-emitting device. A glass or plastics substrate 2 is coated with an anode layer 4, for example in the form of indium tin oxide. The anode can be patterned in the form of elongate strips. The anode layer may be coated with a hole transport layer. A light-emitting polymer layer 6 is then deposited followed by the deposition of an electron transport layer. The device structure is then completed by the deposition of a cathode layer 8. By way of example, the cathode layer can be calcium or aluminium. The cathode layer 8 can be patterned in crosswise strips to define pixels P where the anode and cathode overlap. Alternatively with an unpatterned cathode, light emitting strips can be defined. Further alternatively, the pixels may be defined on an active matrix back-plane and the cathode may be patterned or unpatterned. When an electric field is applied between the anode and cathode, holes and electrons are injected into the light-emitting polymer layer 6. The holes and electrons recombine in the polymer layer and a proportion decay radiatively to generate light.

The hole transport layer can be comprised generally of any compound capable of sustaining hole transport. Examples of suitable materials are organic conductors such as the following conducting polymers: polyaniline, polyethylenedioxythiophene and other polythiophenes, polypyrrole, etc. in their doped forms. Other alternative materials are conjugated polyamines and also low molecular weight amines such as TPD.

The light-emissive layer may comprise any molecular or polymeric compounds which are capable of sustaining charge carrier transport and also capable of light emission under device driving conditions. Examples include fluorescent organic compounds and conjugated polymers such as Alq3, polyphenylenes and derivatives, polyfluorenes and derivatives, polythiophenes and derivatives, polyphenylene vinylenes and derivatives, polymers containing heteroaromatic rings, etc.

The electron transport layer may generally comprise any material capable of sustaining electron transport. Examples include perylene systems, Alq3, polyfluorenes or polyfluorene copolymers, polymers containing heteroaromatic rings, etc.

The device may contain any combination of the above layers provided it includes at least one light-emissive layer.

OLEDs are described in U.S. Pat. No. 5,247,190 or in U.S. Pat. No. 4,539,507, the contents of which are incorporated herein by reference. In U.S. Pat. No. 5,247,190 the active organic layer is a light-emissive semiconductive conjugated polymer and in U.S. Pat. No. 4,539,507 the active organic layer is a light-emissive sublimed molecular film.

Conventionally, the polymer layer is deposited by spin-coating or metered blade-coating a polymer solution onto the anode and then either allowing the solvent to evaporate at RTP, or driving off the solvent using heat treatment and/or reduced pressure. The polymer can be the light-emitting polymer itself cast directly from solution, or a precursor to the polymer, which is converted to the light-emitting polymer during a heat treatment step. The polymer layer can comprise a blend of two or more materials, such as a blend of two or more polymers.

The present applicants realised that it is possible to utilise a different deposition technique for depositing the polymer layer in a light-emitting device, as outlined in British Application No. 9808806.5. According to that British application, the light-emitting polymer is deposited by a technique the same as or similar to inkjet printing by supplying a solution-processible material including the polymer through a plurality of elongate bores, either through the effect of gravity or under pressure or utilising the effect of surface tension. This facilitates direct deposition or patterning of the polymer films as required. FIG. 2 illustrates the essence of the technique.

It is important to use material formulations with which thin polymer films exhibiting excellent emission uniformity can be produced. In this respect, it is important to use formulations which exhibit the desired properties with respect to surface tension, viscosity, concentration, and contact angle (on the depositing medium and the substrate on to which it is to be deposited), and which preferably also exhibit good solution stability.

It is an aim of the present invention to provide formulations which facilitate the direct deposition of patterned polymer films. In particular, it is an aim of the present invention to provide a formulation with which polymer films which exhibit improved emission uniformity can be deposited, particularly in the context of relatively high molecular weight polymers with intrinsically rigid conjugated systems.

According to one aspect of the present invention there is provided a formulation for depositing a polymer layer in a light-emitting device, the formulation comprising a conjugated polymer dissolved in a solvent, the solvent comprising at least one substance selected from the group consisting of terpenes and polyalkylated aromatic compounds.

According to another aspect of the present invention there is provided a method of depositing a polymer layer by supplying a solution processible formulation via a plurality of elongate bores onto a substrate, wherein the formulation comprises a conjugated polymer dissolved in a solvent, the solvent comprising at least one substance selected from the group consisting of terpenes and polyalkylated aromatic compounds.

The solvent used in the formulation preferably consists substantially of at least one substance selected from the group consisting of terpenes and polyalkylated aromatic compounds. In a preferred embodiment, it consists substantially of a blend of two or more solvents belonging to this group.

The terpene may be a hydrocarbon or comprise one or more functional groups selected from the group consisting of alcohol, ester, ether, ketone and aldehyde groups. Monoterpenes are particularly preferred such as terpinolene, limonene and α-terpineol.

The terpene is in liquid form at the deposition temperature.

Preferred polyalkylated aromatic compounds include polyalkyl benzenes such as cymene and isodurene. It is preferred that each of the alkyl substituents on the aromatic ring is distinct from each other, i.e. that they are only bonded together via the aromatic ring.

According to one embodiment, the solvent comprises at least one aromatic compound substituted with alkyl groups at no less than 3 positions.

For the purposes of this application, the term conjugated polymer refers to polymers, including oligomers such as dimers, trimers etc., which are fully conjugated (i.e. are conjugated along the entire length of the polymer chain) or are partially conjugated (i.e. which include non-conjugated segments in addition to conjugated segments).

The polymer may be a polymer suitable for use in a light-emissive layer, a hole transport layer or an electron transport layer in an organic light-emitting device.

In a preferred example, the conjugated polymer can be a light-emitting polymer, hole transport polymer or electron transport polymer itself, or a precursor to a light-emitting polymer, hole transport polymer or electron transport polymer. The conjugated polymer or its precursor can be any suitable polymer, and in particular can be any one of the following:

a) conducting polymers such as polyaniline (PANI) and derivatives, polythiophenes and derivatives, polypyrrole and derivatives, polyethylene dioxythiophene; doped forms of all these and particularly polystyrene sulphonic acid-doped polyethylene dioxythiophene (PEDT/PSS);

b) solution processible charge transporting and/or luminescent/electro-luminescent polymers, preferably conjugated polymers such as: polyphenylenes and derivatives, polyphenylene vinylenes and derivatives, polyfluorenes and derivatives, tri-aryl containing polymers and derivatives, precursor polymers in various forms, copolymers (including the above-named polymer classes), generally random and block copolymers, polymers with the active (charge transporting and/or luminescent) species attached as side-groups to the main chain, thiophenes and derivatives, etc.

It is also envisaged that the present invention is also applicable to formulations comprising other compounds such as solution processible molecular compounds including spiro-compounds, such as described for example in EP-A-0676461; and other inorganic compounds, e.g. solution-processible organometallic precursor compounds to fabricate insulators or conductors.

The specific example discussed herein is a blend of poly-9,9'-dioctylfluorene doped with 5% of a copolymer of poly-9,9'-dioctylfluorene and benzothiadiazole, hereinafter 5BTF8 (80% in weight), and a copolymer of 9,9'-dioctylfluorene and N, N'-diphenyl-(4-s-butylphenyl) amine, hereinafter TFB (20% in weight).

BRIEF DESCRIPTION OF THE DRAWINGS

For a better understanding of the invention and to show how the same may be carried into effect, reference will now be made by way of example to the accompanying drawings in which.

DETAILED DESCRIPTION OF THE PREFERRED EMBODIMENTS

Figure 1:
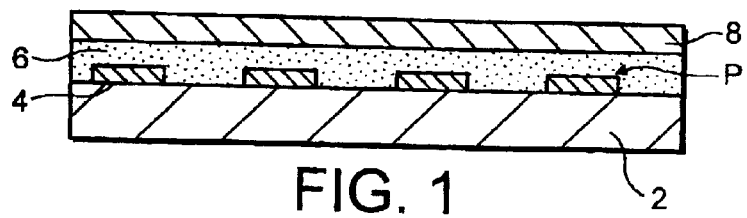
FIG. 1 is a diagram of a light-emitting device.
Figure 2:
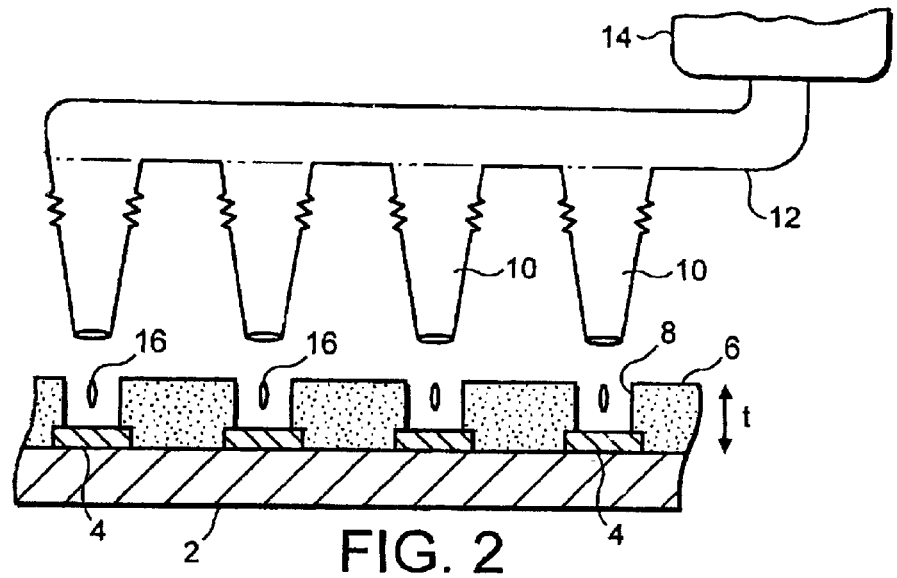
FIG. 2 is a diagram illustrating a method of depositing various polymer layers.
Figure 3A:
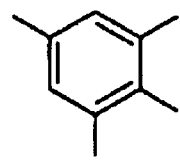
FIGS. 3a to 3e represent the structures of isodurene, terpinolene, limonene cymene and a-terpineol respectively.
Figure 3B:
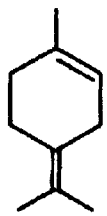
Figure 3C:
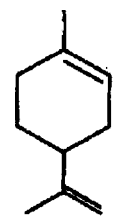
Figure 3D:
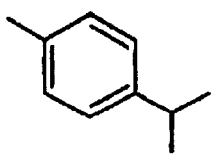
Figure 3E:
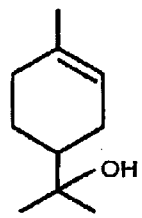

FIG. 2 illustrates a deposition technique for depositing a polymer layer 6 onto the patterned anode 4. A plurality of elongate bores 10 are illustrated, each aligned with a respective trough 8. The elongate bores 10 are connected via a conduit 12 to a reservoir 14 holding the solution to be deposited. The solution is supplied through the elongate bores 10 under pressure or by gravity to deposit the light emitting polymer layer 6. Specific formulations for the solution processible material 16 are discussed herein.

EXAMPLE 1

Figure 4A:
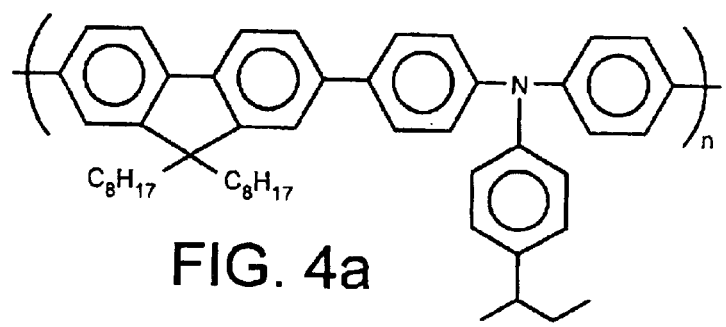
FIGS. 4a to 4c illustrate the formulae of TFB and 5BTF8.
Figure 4B:
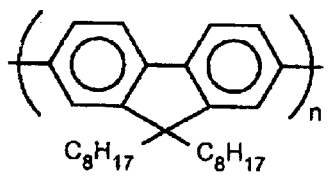
Figure 4C:
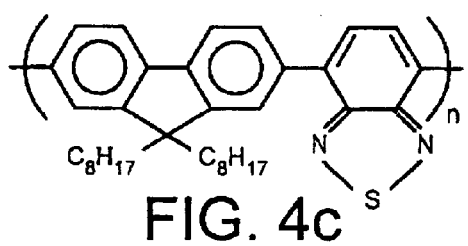

The first exemplified formulation is 0.5% W/V of 5BTF8 (80% in weight) and TFB (20%) in isodurene. The structure of TFB is illustrated in FIG. 4a. 5BTF8 is F8 (structure of FIG. 4b) doped with 5% F8BT (structure of FIG. 4c).

EXAMPLE 2

According to the second example, the formulation comprises 0.5% W/V of 5BTF8 (80% in weight) and TFB (20%) in a solvent comprising a blend of isodurene:terpinolene (3:1).

EXAMPLE 3

According to a third example, the formulation comprises 0.5% W/V of 5BTF8 (80% in weight) and TFB (20%) in isodurene:limonene (3:1).

EXAMPLE 4

According to a fourth example, the formulation comprises 0.5% W/V of 5BTF8 (80% in weight) and TFB (20%) in isodurene:cymene (3:1).

Figure 5:
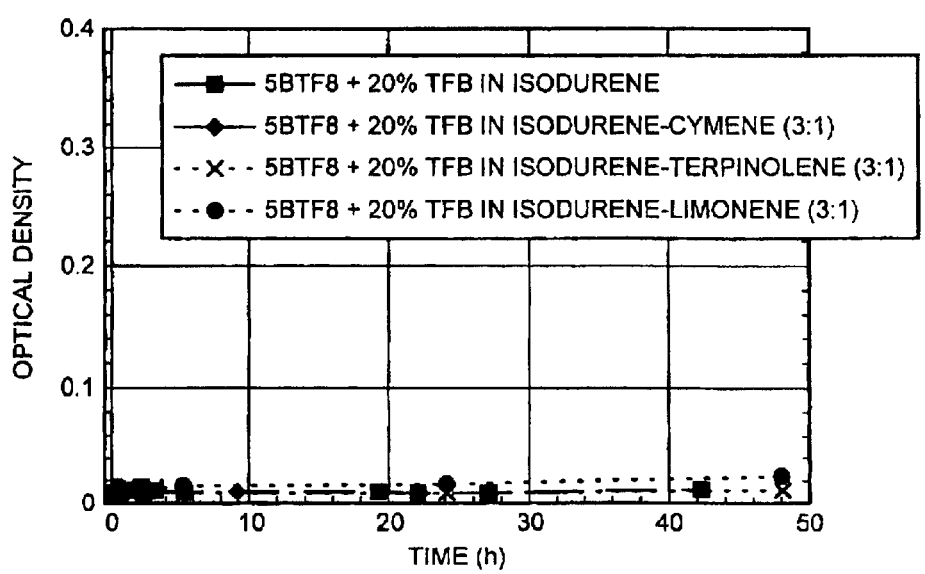
FIG. 5 is a graph of optical density versus time illustrating the improved solubility stability of the solvents discussed herein.

Using the formulation according to each example, a polymer layer was deposited using the technique described in relation to FIG. 2. The solubilities were measured with over a 48 hour period at 17° C. The results are plotted in FIG. 5, from which it can readily be seen that they display excellent stability of solubility over that period.

Figure 6:
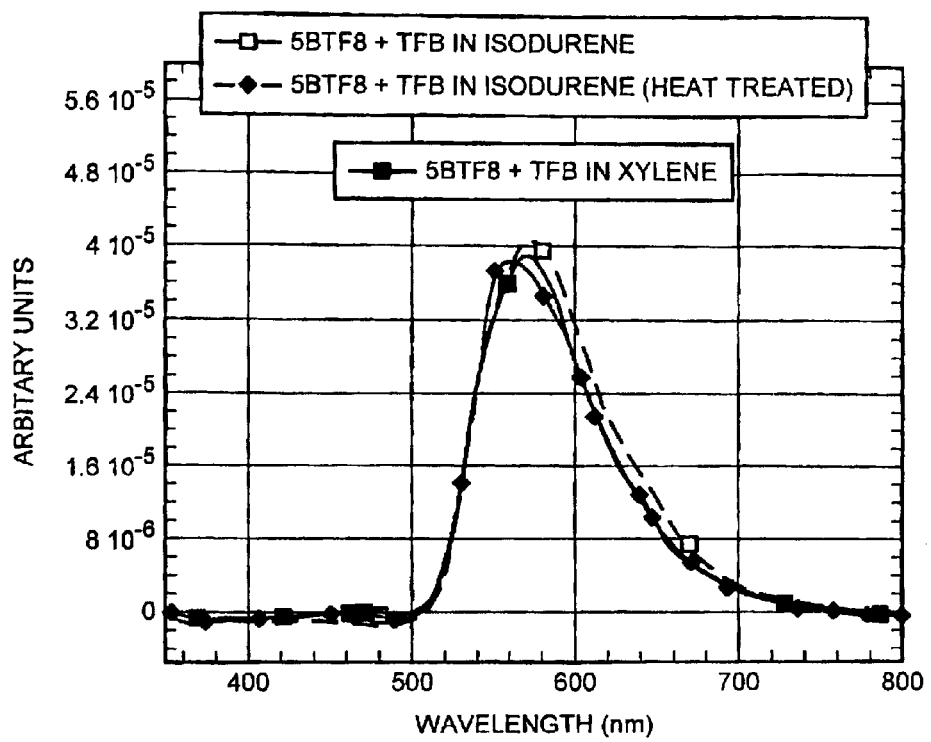
FIG. 6 is a graph showing the photoluminescent properties of a polymer layer deposited in isodurene.
Figure 7:
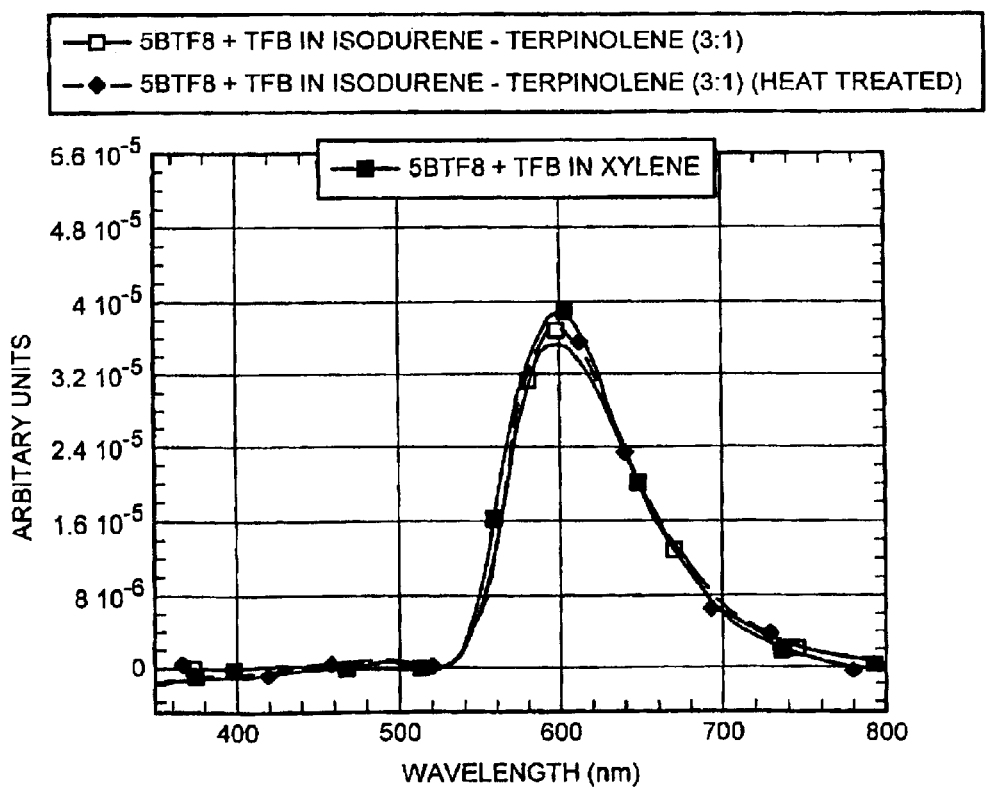
FIG. 7 is a graph comparing the photoluminescent properties of a polymer deposited in isodurene-terpinolene (3:1) and xylene.

Subsequently, the photoluminescent properties of Examples 1 and 2 were compared with photoluminescent properties of a polymer deposited using a xylene solvent. FIG. 6 illustrates the results of Example 1, where the solvent is isodurene and FIG. 7 illustrates the results for Example 2 where the solvent is isodurene-terpinolene (3:1). FIGS. 6 and 7 also illustrate the case where the polymer layer deposited in the novel solvent is heat-treated after deposition.

As can be seen, there are no significant changes in the photoluminescent properties as regards the wavelength of emission. Thus, a light-emitting device can be manufactured with known and specified light-emission properties, but with significant improvements in stability by using the novel formulations defined herein.

What is claimed is:

1. A formulation for depositing a polymer layer in a light emitting device, the formulation comprising a conjugated polymer dissolved in a solvent, the solvent consisting of at least one substance selected from the group consisting of terpenes and polyalkylated aromatic compounds.

2. A formulation according to claim 1, wherein the terpene is a monoterpene.

3. A formulation according to claim 1, wherein the terpene includes one or more groups selected from alcohol, ester, ether, ketone, aldehyde groups and hydrocarbons.

4. A formulation according to claim 3, wherein the terpene is one selected from the group consisting of terpinolene, limonene and a terpineol.

5. A formulation according to claim 1, wherein the polyalkylated aromatic compound is a polyalkylated benzene.

6. A formulation according to claim 1, wherein the polyalkylated benzene is a dialkylbenzene.

7. A formulation according to claim 6, wherein the dialkylbenzene is selected from the group consisting of cymene, diethylbenzene, 1-methyl-4-t-butylbenzene.

8. A formulation according to claim 5, wherein the polyalkylated benzene is a tetraalkylbenzene.

9. A formulation according to claim 8, wherein the tetraalkylbenzene is isodurene.

10. A formulation according to claim 1, wherein the polymer is a light emissive polymer.

11. A formulation according to claim 1, wherein the polymer comprises a fluorene based polymer.

12. A formulation according to claim 1, wherein the polymer comprises a polymer containing fluorene and triarylamine units.

13. A formulation according to claim 1, wherein the polymer comprises a blend of a fluorene based polymer and a polymer containing fluorene and triarylamine units.

14. A formulation according to claim 13, wherein the polymer is a blend of poly-9.9'-dioctylfluorene doped with 5% of a copolymer of poly-9.9'-dioctylfluorene and benzothiadiazole.

15. A formulation according to claim 14, wherein the polymer is a blend of a copolymer of 80 wt. % 9.9'-dioctylfluorene and 20 wt. % N, N'-diphenyl-(4-s-butylphenyl) amine.

16. A formulation according to claim 1, wherein the solvent comprises a blend of two or more of said substances.

17. A formulation according to claim 16, wherein the blend comprises two or more substances selected from the solvent group consisting of isodurene, cymene, terpinolene, limonene and a terpineol.

18. A formulation according to claim 17, wherein the blend contains 3 parts isodurene to 1 part of another member of the solvent group.

19. A formulation according to claim 18, wherein the blend is 3 parts isodurene and 1 part terpinolene.

20. A formulation according to claim 18, wherein the blend is 3 parts isodurene and 1 part limonene.

21. A formulation according to claim 18, wherein the blend is 3 parts isodurene and 1 part cymene.

22. A method of depositing a polymer layer by supplying a solution processible formulation via a plurality of elongate bores onto a substrate, wherein the formulation comprises a conjugated polymer dissolved in a solvent, the solvent comprising at least one substance selected from the group consisting of terpenes and polyalkylated aromatic compounds.

* * * * *